(12) United States Patent
Yang et al.

(10) Patent No.: US 8,217,394 B2
(45) Date of Patent: Jul. 10, 2012

(54) PROBE PAD ON A CORNER STRESS RELIEF REGION IN A SEMICONDUCTOR CHIP

(75) Inventors: Chung-Ying Yang, Taoyuan (TW); Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/180,304

(22) Filed: Jul. 11, 2011

(65) Prior Publication Data

US 2011/0266541 A1 Nov. 3, 2011

Related U.S. Application Data

(63) Continuation-in-part of application No. 11/801,529, filed on May 10, 2007, now abandoned.

(51) Int. Cl.
*H01L 23/58* (2006.01)

(52) U.S. Cl. .................. 257/48; 257/E29.013

(58) Field of Classification Search .................... 257/48, 257/619–620, 438, 127, 725, E29.013; 438/113, 438/458, 462
See application file for complete search history.

(56) References Cited

U.S. PATENT DOCUMENTS

| | | | |
|---|---|---|---|
| 5,942,766 A | 8/1999 | Frei | |
| 6,300,223 B1 | 10/2001 | Chang et al. | |
| 6,621,285 B1 * | 9/2003 | Yatsu | 324/762.05 |
| 7,253,487 B2 * | 8/2007 | Chen | 257/409 |
| 7,256,475 B2 | 8/2007 | Jao et al. | |
| 7,265,436 B2 | 9/2007 | Huang et al. | |
| 7,307,441 B2 | 12/2007 | Sohn et al. | |
| 7,400,134 B2 | 7/2008 | Morishita et al. | |
| 7,482,675 B2 | 1/2009 | Adkisson et al. | |
| 7,566,915 B2 * | 7/2009 | Chang et al. | 257/127 |
| 7,679,384 B2 | 3/2010 | Chen et al. | |
| 2004/0150070 A1 * | 8/2004 | Okada et al. | 257/508 |
| 2005/0098893 A1 | 5/2005 | Tsutuse et al. | |
| 2006/0001165 A1 | 1/2006 | Tokitoh et al. | |
| 2006/0109014 A1 | 5/2006 | Chao et al. | |
| 2007/0077666 A1 | 4/2007 | Sogawa | |
| 2007/0187845 A1 * | 8/2007 | Fu et al. | 257/797 |
| 2008/0191205 A1 * | 8/2008 | Tsai et al. | 257/48 |
| 2008/0224135 A1 | 9/2008 | Filippi et al. | |
| 2008/0277659 A1 | 11/2008 | Hsu et al. | |
| 2008/0290340 A1 * | 11/2008 | West | 257/48 |
| 2010/0078769 A1 * | 4/2010 | West et al. | 257/620 |
| 2011/0284843 A1 | 11/2011 | Chen et al. | |

* cited by examiner

*Primary Examiner* — Kiesha Bryant
*Assistant Examiner* — Ali Naraghi
(74) *Attorney, Agent, or Firm* — Slater & Matsil, L.L.P.

(57) ABSTRACT

A semiconductor chip includes a circuit region and a corner stress relief (CSR) region. The CSR region is in a corner of the semiconductor chip. A device under test (DUT) structure or a functional circuit is disposed on the circuit region. A probe pad is disposed on the CSR region. A metal line extends from the circuit region to the CSR region to electrically connect the probe pad to the DUT structure or a functional circuit.

20 Claims, 7 Drawing Sheets

PROBE PAD ON A CORNER STRESS RELIEF REGION IN A SEMICONDUCTOR CHIP

This application is a continuation-in-part of U.S. patent application Ser. No. 11/801,529, filed on May 10, 2007, entitled "Test Structure for Semiconductor Chip" which application is hereby incorporated herein by reference. This application is related to U.S. patent application Ser. No. 13/198,408, filed on Aug. 4, 2011, entitled, "Probe Pad on a Corner Stress Relief Region in a Semiconductor Chip".

TECHNICAL FIELD

The disclosure relates generally to semiconductor chip designs and, more particularly, to a semiconductor chip having a probe pad on a corner stress relief region in the semiconductor chip.

BACKGROUND

In integrated circuit (IC) manufacturing, a semiconductor wafer typically contains a plurality of testlines in the scribe line region between adjacent semiconductor chips. Each testline includes a plurality of probe pads connected to a number of devices under test (DUTs), which are structures similar to those that are normally used in the integrated circuit products in the circuit region. DUTs are usually formed in the scribe line regions on a testline at the same time as the functional circuits using the same process steps. Probe pads are usually flat, square metal surfaces on a testline through which test stimuli can be applied to corresponding DUTs. Parametric test results on DUTs are usually utilized to monitor, improve and refine a semiconductor manufacturing process. Yield of test structures on a testline is often used to predict the yield of functional integrated circuits in the circuit region.

After manufacturing, the semiconductor wafer is sawed from the scribe line regions to separate the semiconductor chips, so that each of the semiconductor chips may be packaged individually. Therefore, the probe pads and DUTs in the scribe line regions are destroyed. After the dicing process, it is not possible to perform parametric tests on DUTs to predict the yield of functional integrated circuits in the circuit regions. The yield of individual semiconductor chips after dicing can not be accurately controlled.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn to different scales for simplicity and clarity.

A plurality of semiconductor chip regions is marked on the semiconductor substrate by scribe lines between the chip regions. The semiconductor substrate will go through a variety of cleaning, layering, patterning, etching and doping steps to form integrated circuits. The term "semiconductor substrate" herein generally refers to the semiconductor bulk substrate on which various layers and device structures may be formed. In some embodiments, the semiconductor bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
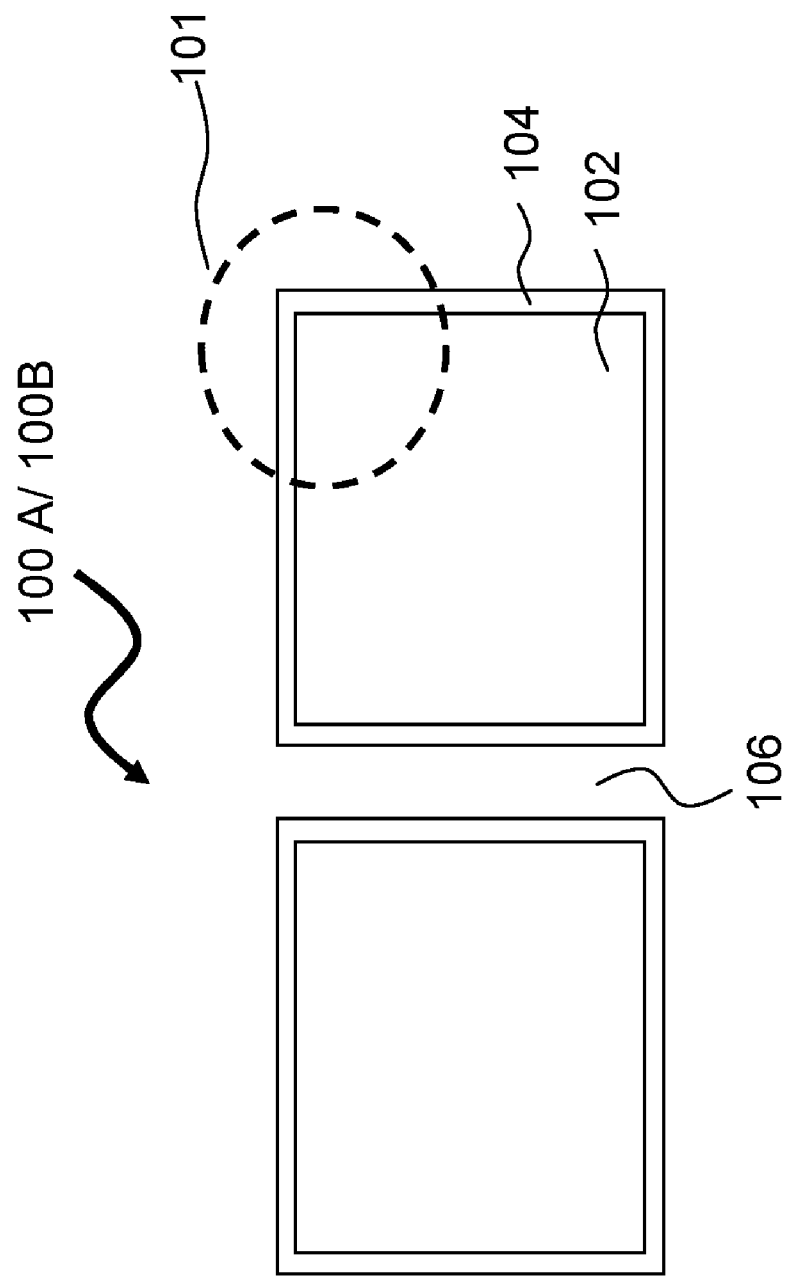
FIG. 1 is a top view of two semiconductor chips with seal ring structures according to various aspects of the present disclosure.

FIG. 1 is a top view of two semiconductor chips with seal ring structures according to various aspects of the present disclosure. A semiconductor chip 100A or 100B includes a circuit region 102, a seal ring region 104 and a scribe line region 106. The seal ring region 104 and the scribe line region 106 surrounds the circuit region 102. The seal ring region 104 is for forming a seal ring structure thereon and the circuit region 102 is for forming at least a device structure as previously described. The seal ring structure surrounds the circuit region 102 to protect the integrated circuits in the circuit region 102 from moisture degradation, ionic contamination, and damage during dicing and packaging processes. In some embodiments, the seal ring structure is constructed over the seal ring region 104 simultaneously with the construction of interconnects (not shown) in the circuit region 102. The seal ring structure and interconnects may be comprised of various stacked metallization layers and via layers disposed within one or more dielectric layers.

Figure 2:
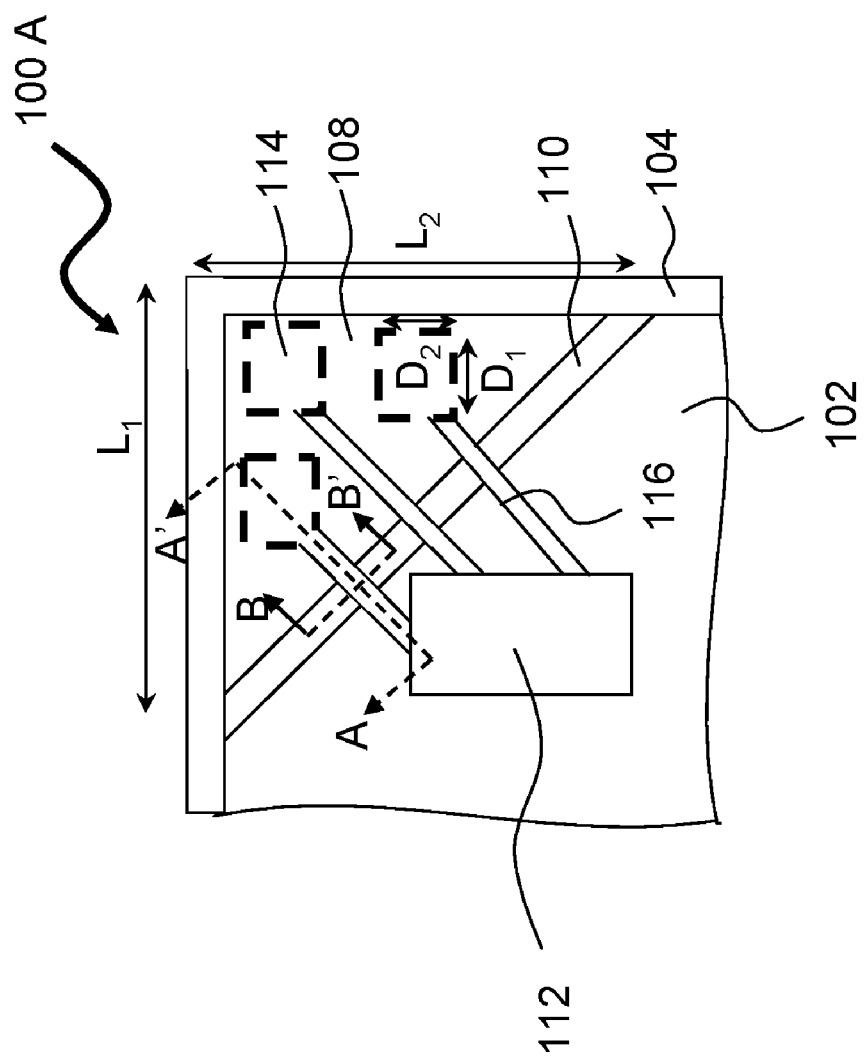
FIG. 2 is an enlarged view of a portion of the semiconductor chip depicted in FIG. 1.

FIG. 2 is an enlarged view of a portion 101 of the semiconductor chip 100A depicted in FIG. 1. The semiconductor chip 100A includes the circuit region 102, a corner stress relief (CSR) region 108 and the seal ring region 104. The seal ring region 104 having a seal ring structure surrounds the circuit region 102 and the CSR region 108. The CSR region 108 is in a corner of the semiconductor chip 100A. The CSR region 108 may be designed on the chip 100A to prevent cracking of the chip induced by stress from backend processing such as die-sawing, packing, and plastic molding. The functional circuits are excluded from the CSR region 108 because it is a region that may experience greater stress during and after backend processing. In one embodiment, the CSR region 108 occupies a substantially right triangular area having perpendicular edges, the perpendicular edges having lengths of L1 and L2, respectively. The lengths L1 and L1 are within a range from about 30 μm to about 100 μm.

In one embodiment, an enhanced structure 110 is formed between the circuit region 102 and the CSR region 108. The enhanced structure 110 connects sides of the seal ring structure on the seal ring region 104. The enhanced structure 110 is additional stacked metallization layers and vias that are formed simultaneously with the formation of the seal ring structure, and physically join the seal ring structure. It is believed that the corner region has greater stress than other regions of the semiconductor chip 100A. With the formation of the enhanced structure 110, more metal structures exist at the corner region. The stress applied to the seal ring structure may thus be spread to more metal structures, and hence the seal ring structure is less likely to be damaged by stresses.

The semiconductor chip 100A further includes various electrical elements 112 disposed on the circuit region 102. The electrical elements 112 of FIG. 2 may include various device under test (DUT) structures and various functional circuits. According to some embodiments, the DUT structures 112 are test structures in the form of resistors, capacitors, inductors, diodes, transistors, or the like, designed to measure device parameters, such as MOSFET threshold voltage (Vt), contact/via chain resistance, sheet capacitance, gate oxide breakdown voltage, and the like. By studying these parameters, it is possible to monitor, improve and refine a semiconductor production process. According to other embodiments, the functional circuits 112 are capable of operating the plurality of semiconductor device structures as previously described in the semiconductor chip 100A. For the sake of simplicity, the DUT structure 112 is used for illustration in the following sections. In some embodiments, the DUT structure 112 may be replaced by the functional circuit 112.

The semiconductor chip 100A includes a first set of probe pads 114 disposed on the CSR region 108. The semiconductor chip 100A further includes a metal line 116 extending from the circuit region 102 and traversing the enhanced structure 110 into the CSR region 108. The metal line 116 electrically connects the DUT structure 112 and the first probe pad 114. The metal line 116 enables the previously described measurement of the DUT structures 112 through the first probe pad 114.

The first probe pad 114 occupies a substantially rectangular area having edges, each long edge having a length D1 and each short edge having a length D2, respectively. In one embodiment, the lengths D1 and D2 are within a range from about 10 μm to about 20 μm. The lengths D1 and D2 are within a ratio from about 20% to about 50% of the lengths L1 and L2 of the CSR region 108. Advantageously, the lengths D1 and D2 of the first probe pad 114 and the ratio of lengths D1/D2 to lengths L1/L2 in the above ranges keep enough operational space for test stimuli in the CSR region 108 without consuming extra space for functional integrated circuits in the circuit region 102. In some embodiments, D1 can equal D2.

In one embodiment, the first set of probe pads 114 comprises at least two probe pads. In the measurement of device parameters, a current from a current source may pass through test stimuli connected to the two probe pads. The device parameters of the DUT structures 112 connected to the two probe pads could be measured. In another embodiment, the first set of probe pads 114 may comprise three probe pads disposed on the CSR region 108. Combinations of measurements are performed to collect as much information as possible regarding the first probe pads 114 and the DUT structures 112 between them.

In another embodiment, a second set of probe pads (not shown) is disposed on the seal ring region 104. The second set of probe pads are electrically connected to the DUT structures 112. Each of the second set of probe pads occupies a substantially rectangular area having edges. Each edge has a length less than a width of the seal ring structure in the seal ring region 104. The second set of probe pads are superimposed on the seal ring structure or are the top portion of the seal ring structures. The second set of probe pads do not reduce the integrity of the seal ring structure to protect the integrated circuits from moisture degradation, ionic contamination, and damage during dicing and packaging processes.

Figure 3A:
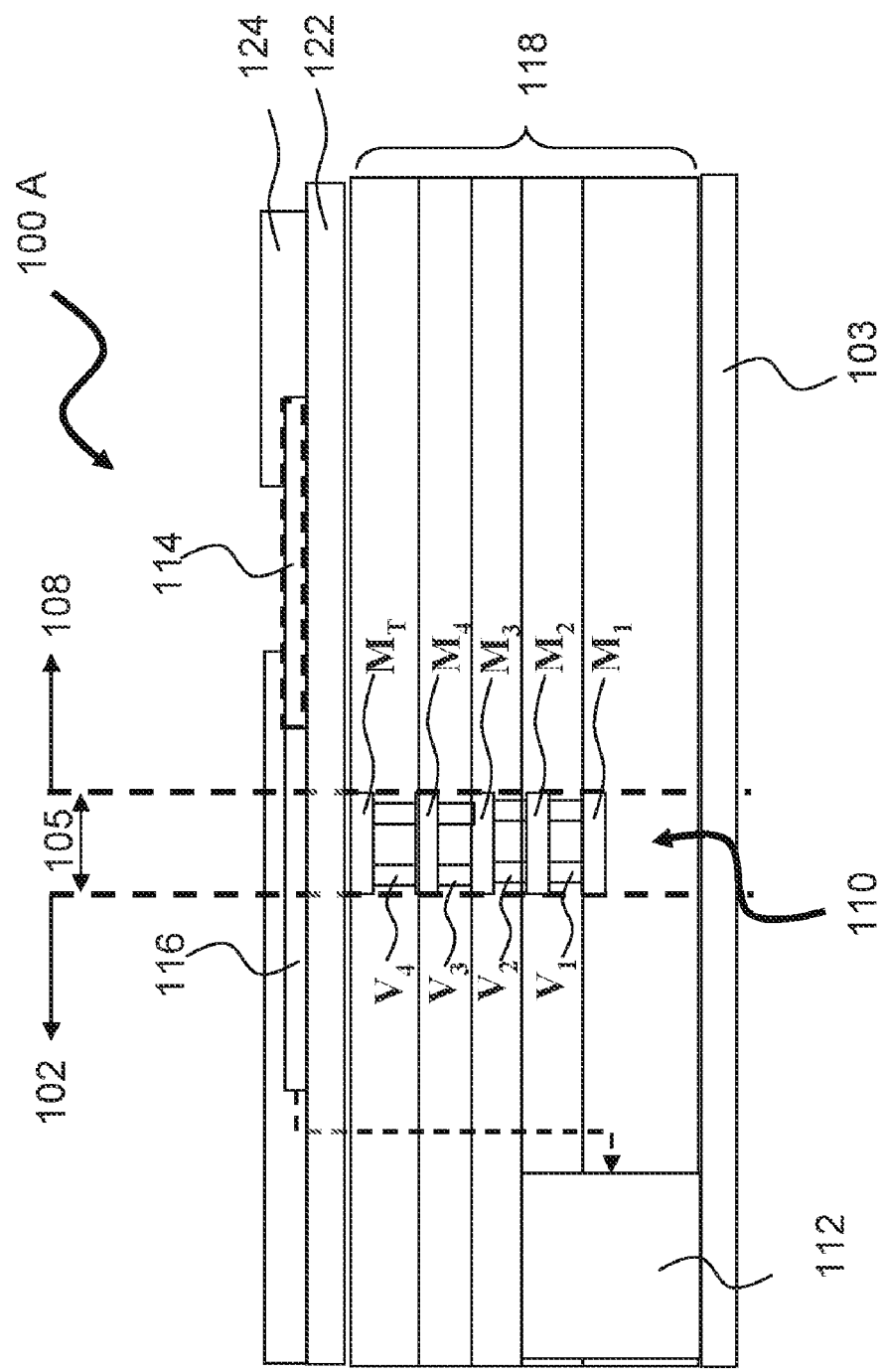
FIG. 3A is one aspect of a cross-sectional view along line A-A' in FIG. 2 of the portion of the semiconductor chip of the present disclosure.

FIG. 3A illustrates one embodiment of a cross-sectional view obtained from the vertical plane crossing line A-A' in FIG. 2. The semiconductor chip 100A may include a semiconductor substrate 103 having the circuit region 102, an enhanced region 105 and the CSR region 108. The enhanced region 105 having the enhanced structure 110 is disposed between the circuit region 102 and the CSR region 108. The semiconductor substrate 103 may include silicon or a compound semiconductor, such as GaAs, InP, Si/Ge, or SiC. The substrate 103 may further include doped regions, such as a P-well, an N-well, and/or a doped active region such as a P+ doped active region.

The semiconductor chip 100A may further include isolation structures, such as shallow trench isolation (STI) features or LOCOS features (not shown) formed in the substrate 103 for isolating circuits from other regions in the substrate. The semiconductor chip 100A may further include device structures such as transistors, resistors, and/or capacitors (not shown) overlying the substrate 103.

The semiconductor chip 100A includes multiple dielectric layers 118 disposed over the substrate 103. In some embodiments, the dielectric layers 118 are formed of low-k dielectric materials with dielectric constants (k values) between about 2.9 and 3.8, ultra low-k (ULK) dielectric materials with k values between about 2.5 and about 2.9, oxide, undoped silicate glass (USG), or silicon dioxide ($SiO_2$). Typically the lower k value a dielectric layer 118 has, the more fragile and prone to delamination and cracking the layer becomes. In some embodiments, multiple dielectric layers 118 comprise top-level dielectric layers and bottom-level dielectric layers. A dielectric constant of the bottom-level dielectric layer(s) is less than a dielectric constant of the top-level dielectric layer(s). The top-level dielectric layer has more capability to decrease corrosion or mechanical damage to the underlying integrated circuits than the bottom-level dielectric layer.

The semiconductor chip 100A may further include various device under test (DUT) structures 112 disposed on the circuit region 102. The DUT structures 112 are test structures in the form of resistors, capacitors, inductors, diodes, transistors, or the like. The DUT structure 112 shown in FIG. 3A is merely an example to illustrate the DUT structure 112 is on the circuit region 102. It is not intended to limit in which layer the DUT structure 112 is embedded.

Referring to FIG. 3A, a plurality of stacked metallization layers and via layers are formed and embedded in the dielectric layers 118. In one embodiment, the plurality of metallization layers include a top-most metal layer $M_T$ and other metal layers $M_1$-$M_4$ underlying the top-most metal layer $M_T$. Vertical columnar vias $V_1$-$V_4$ interconnect every two metallization layers $M_1$-$M_T$. Each of the metallization layers includes a plurality of metal features in the circuit region 102, the enhanced region 105 and/or the CSR region 108. In the enhanced region 105, the plurality of stacked metal features and via layers form an enhanced structure 110. Such configuration of the enhanced structure 110 protects the integrated circuits in the circuit regions 102 and provides defense from dicing or packaging damage. In the circuit region 102, the plurality of stacked metal features and via layers provides interconnections between devices structures, circuits and inputs/outputs. The metallization layers and via layers may include aluminum, aluminum alloy, copper, copper alloy, titanium, titanium nitride, tantalum, tantalum nitride, tungsten, metal silicide, or combinations thereof.

Still referring to FIG. 3A, a passivation layer 122 is disposed over the multiple dielectric layers 118 and the enhanced structure 110. The passivation layer 122 includes one or more layers, such as silicon nitride (SiN) or silicon oxynitride (SiON). The passivation layer 122 prevents or decreases moisture, mechanical, and radiation damage to the integrated circuits.

Next, a conductive layer is disposed over the passivation layer 122. Various depositing, patterning and etching processes may be used to form the structures of the first probe pads 114 and the metal line 116 in the same conductive layer. The metal line 116 extends from the circuit region 102, traverses the enhanced structure 110, and connects to the first probe pad 114 in the CSR region 108. The metal line 116 passes over the enhanced structure 110 with the passivation layer 122 between metal line 116 and the top-most metal layer $M_T$ of the enhanced structure 110. In one example, the conductive layer of the first probe pad 114 and the metal line 116 may include aluminum or aluminum alloy.

Still referring to FIG. 3A, a polyimide layer 124 is disposed over the conductive layer and the passivation layer 122. The polyimide layer 124 serves as a stress buffer to reduce the stress transfer to the passivation layer 122 during an assembly process. An opening is defined in the polyimide layer 124 by patterning and etching processes to expose a portion of the first probe pad 114 for the measurement of device parameters.

Figure 3B:
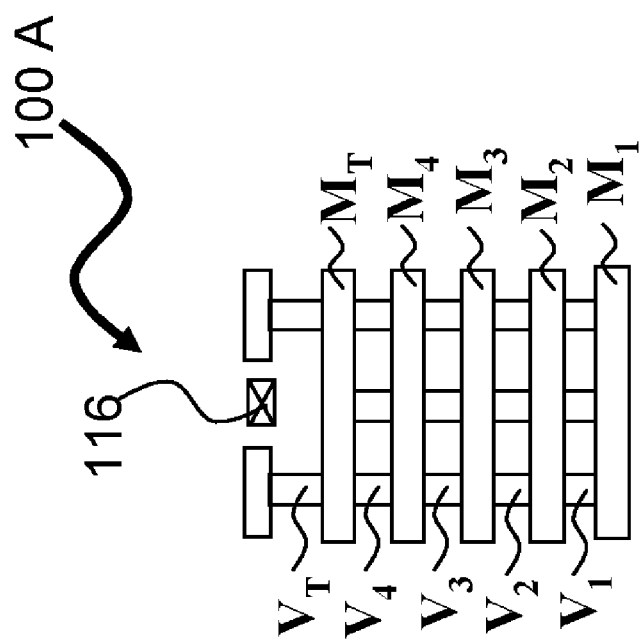
FIG. 3B is one aspect of a cross-sectional view along line B-B' in FIG. 2 of the portion of the semiconductor chip of the present disclosure.

FIG. 3B illustrates one embodiment of a cross-sectional view obtained from the vertical plane crossing line B-B' in FIG. 2. The semiconductor chip 100A includes a via layer $V_T$ embedded in the passivation layer 122. The via layer $V_T$ contacts with the top-most metal layer $M_T$ of the enhanced structure 110 and the overlying conductive layer which the metal line 116 exists. The metal line 116 is isolated from the enhanced structure 110. A gap is formed in the conductive layer and the metal line 116 passes through the gap. Hence, the metal line 116 is also isolated form the other portion of the conductive layer. The metal line 116 extends from the circuit region 102, traverses the enhanced structure 110, and connects to the first probe pad 114 in the CSR region 108. Advantageously, the structure of semiconductor chip 100A keeps the integrity of the enhanced structure 110 without reducing mechanical strength to prevent chip edge cracks.

Figure 4A:
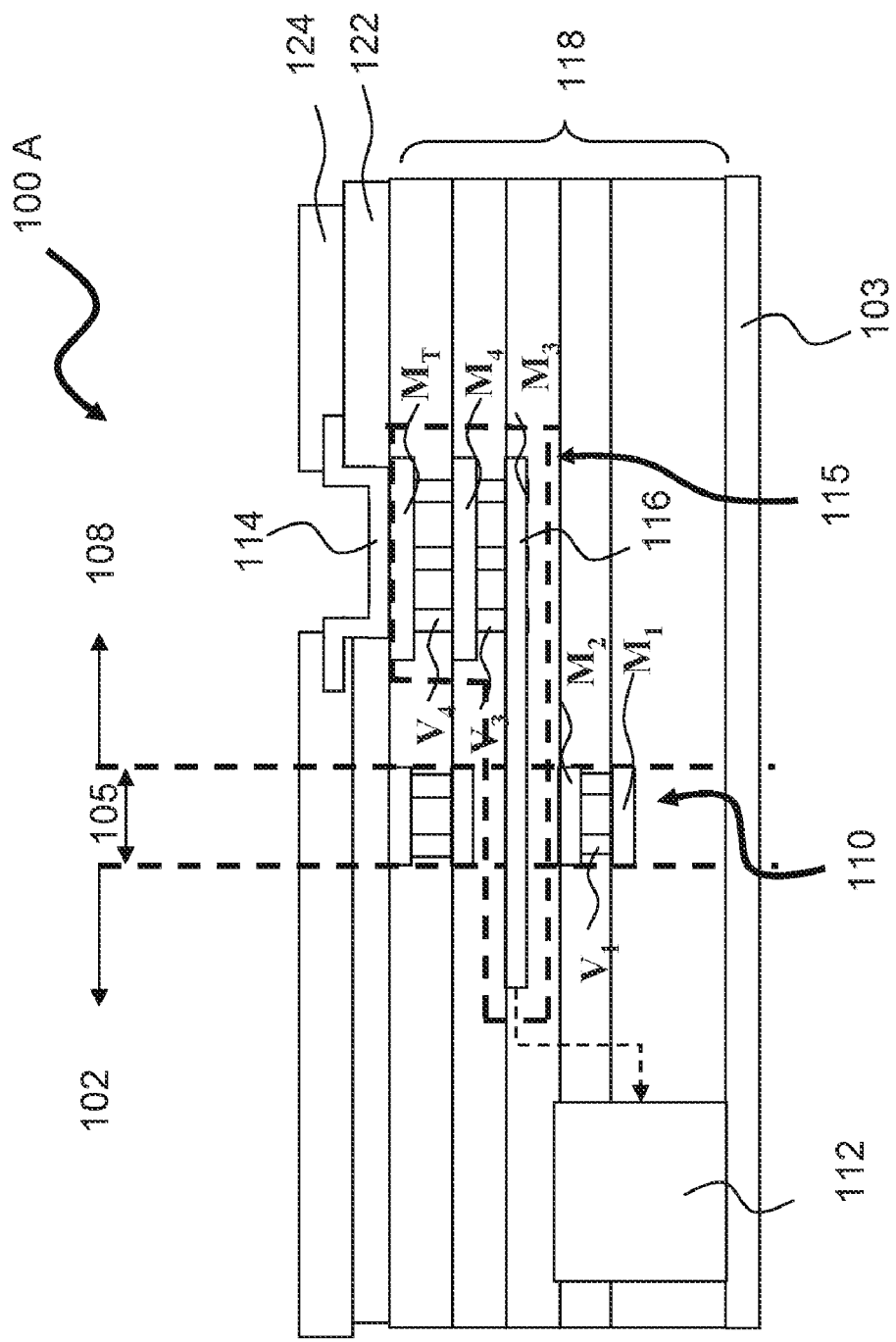
FIG. 4A is another aspect of a cross-sectional view along line A-A' in FIG. 2 of the portion of the semiconductor chip of the present disclosure.

FIG. 4A illustrates another embodiment of a cross-sectional view obtained from the vertical plane crossing line A-A' in FIG. 2. Some of the structures may be substantially similar to the embodiments disclosed in FIG. 3A and the description of the common structures are not repeated here although fully applicable in this embodiment as well.

Referring to FIG. 4A, the semiconductor chip 100A may include a semiconductor substrate 103 having the circuit region 102, the enhanced region 105 and the CSR region 108. The enhanced region 105 having the enhanced structure 110 is disposed between the circuit region 102 and the CSR region 108.

The semiconductor chip 100A includes multiple dielectric layers 118 disposed the substrate 103. In some embodiments, multiple dielectric layers 118 comprise top-level dielectric layers and bottom-level dielectric layers. A dielectric constant of the bottom-level dielectric layer(s) is less than a dielectric constant of the top-level dielectric layer(s). The top-level dielectric layer has more capability to decrease corrosion or mechanical damage to the underlying integrated circuits than the bottom-level dielectric layer. Details of the materials of multiple dielectric layers 118 can be found in text associated with the semiconductor chip 100A in FIG. 3A and are not repeated here.

The semiconductor chip 100A may further include various device under test (DUT) structures 112 disposed on the circuit region 102. The DUT structures 112 are test structures in the form of resistors, capacitors, inductors, diodes, transistors, or the like. The DUT structure 112 shown in FIG. 4A is merely an example to illustrate the DUT structure 112 is on the circuit region 102. It is not intended to limit in which layer the DUT structure 112 is embedded.

Referring to FIG. 4A, a plurality of stacked metallization layers and via layers are formed and embedded in the dielectric layers 118. In one embodiment, the plurality of metallization layers include a top-most metal layer $M_T$ and other metal layers $M_1$-$M_4$ underlying the top-most metal layer $M_T$. Vertical columnar vias $V_1$-$V_4$ interconnect every two metallization layers $M_1$-$M_T$. Each of the metallization layers includes a plurality of metal features in the circuit region 102, the enhanced region 105 and/or the CSR region 108. In the enhanced region 105, the plurality of stacked metal features and via layers form the enhanced structure 110. Such configuration of the enhanced structure 110 provides defense from dicing or packaging damage. In the circuit region 102, the plurality of stacked metal features and via layers provides interconnections between devices structures, circuits and inputs/outputs. In the CSR region 108, the plurality of stacked metal features and via layers form an interconnect structure 115. The interconnect structure 115 comprises a metal line 116 in one of the metallization layers. The metal line 116 extends from the CSR region 108, traverses the enhanced structure 110, and enters the circuit region 102. Through the metal line 116, the interconnect structure 115 electrically connects the DUT structure 112 and the overlying first pad layer 114 which will be formed later. Details of the materials of the metallization layers and via layers can be found in text associated with the semiconductor chip 100A in FIG. 3A and are not repeated here.

Still referring to FIG. 4A, a passivation layer 122 is disposed over the multiple dielectric layers 118, the enhanced structure 110 and the interconnect structure 115. The passivation layer 122 includes one or more layers, such as silicon nitride (SiN) or silicon oxynitride (SiON). The passivation layer 122 prevents or decreases moisture, mechanical, and radiation damage to the integrated circuits. Thereafter, an opening is defined in the passivation layer 122 by patterning and etching processes to expose a portion of the top-most metal layer $M_T$.

Next, a conductive layer is disposed over the passivation layer 122 and over the exposed portion of the top-most metal layer $M_T$. Various depositing, patterning and etching processes may be used to form the structures of the first probe pad 114 in the conductive layer. In one example, the conductive layer of the first probe pad 114 may include aluminum or aluminum alloy.

Still referring to FIG. 4A, a polyimide layer 124 is disposed over the conductive layer and the passivation layer 122. The polyimide layer 124 serves as a stress buffer to reduce the stress transfer to the passivation layer 122 during an assembly process. An opening is defined in the polyimide layer 124 by patterning and etching processes to expose a portion of the first probe pad 114 for the measurement of device parameters.

Figure 4B:
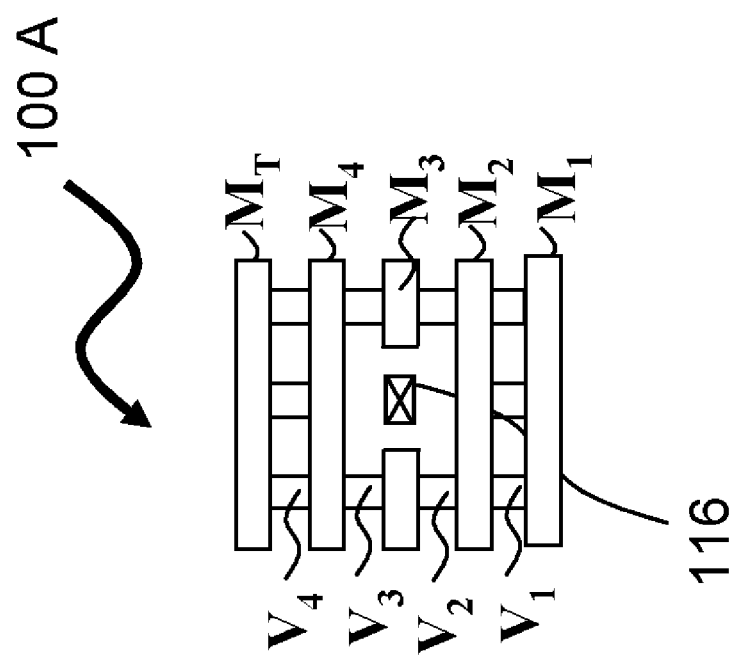
FIG. 4B is another aspect of a cross-sectional view along line B-B' in FIG. 2 of the portion of the semiconductor chip of the present disclosure.

FIG. 4B illustrates another embodiment of a cross-sectional view obtained from the vertical plane crossing line B-B' in FIG. 2. In this example, the plurality of metallization layers include a top-most metal layer $M_T$ and other metal layers $M_1$-$M_4$ underlying the top-most metal layer $M_T$. Vertical columnar vias $V_1$-$V_4$ interconnect every two metallization layers $M_1$-$M_T$. The interconnect structure 115 includes metal layers $M_3$-$M_T$ and the vertical columnar vias $V_3$-$V_4$. The metal line 116 is in one of the metallization layers, $M_3$. The enhanced structure 110 includes metal layers $M_1$-$M_T$ and the vertical columnar vias $V_1$-$V_4$. A gap is formed in the metallization layer $M_3$ of the enhanced structure 110 and the metal line 116 of the interconnect structure 115 passes through the gap. Hence, the metal line 116 is isolated form the enhanced structure 110. The metal line 116 extends from the circuit region 102, traverses the enhanced structure 110, and electrically connects to the probe pad 114 in the CSR region 108. In another example, the enhanced structure 110 may occupy fewer metallization layers and via layers than the interconnect structure 115 does. The metal line 116 of the interconnect structure 115 may pass under the enhanced structure 110. Advantageously, the structure of semiconductor chip 100A keeps the integrity of the enhanced structure 110 without reducing mechanical strength to prevent chip edge cracks.

Figure 5:
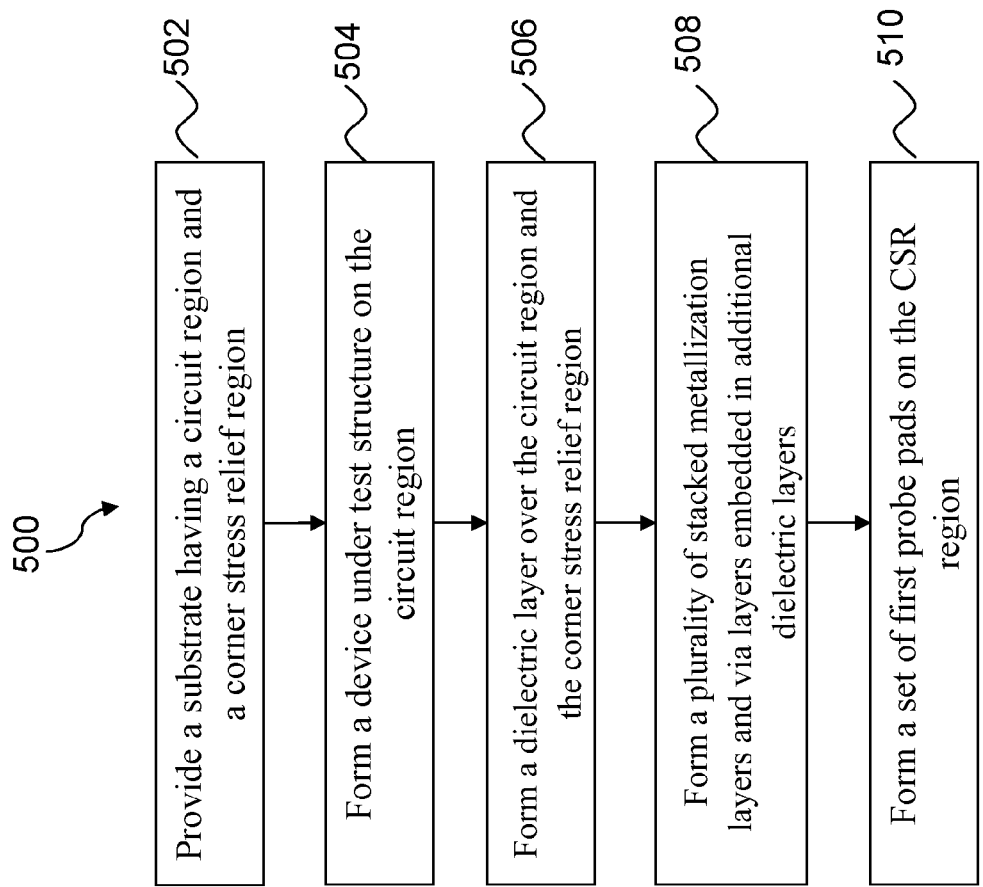
FIG. 5 is a flowchart of a method for fabricating an integrated circuit on a semiconductor chip at various stages according to embodiments of this disclosure.

Referring now to FIG. 5, method 500 for fabricating an integrated circuit on a semiconductor chip begins with block 502. At block 502, a semiconductor substrate is provided. The substrate has a circuit region, an enhanced region and a corner stress relief (CSR) region. The enhanced region is between the circuit region and the CSR region.

The method 100 continues with block 504 in which an electrical element is formed on the circuit region, i.e., over the semiconductor substrate. The electrical element may include a device under test (DUT) structure or a functional circuit. A plurality of device structures may be formed on the circuit region.

The method 100 continues with block 506 in which a dielectric layer is formed over the circuit region, the enhanced region and the CSR region. The dielectric layer is formed by deposition techniques, such as chemical vapor deposition (CVD) and/or a high density plasma (HDP) CVD process.

The method 100 continues with block 508 in which a plurality of stacked metallization layers and via layers are formed and embedded in additional dielectric layers. The metallization layers and the via layers may be formed by various depositing, patterning and etching techniques. The metallization layers and via layers may include a conductive material such as aluminum, aluminum alloy, copper, copper alloy, or combinations thereof. In one embodiment, interconnects in the circuit region, an enhanced structure in the enhanced region, and a interconnect structure in the CSR region are all constructed in this operation. Interconnects, the enhanced structure and the interconnect structure may be comprised of various stacked metallization layers and via layers disposed within stacked dielectric layers. Interconnects, layers of the enhanced structure and layers of the interconnect structure share the same metallization layer and via layer. A gap is formed on one of the metallization layer of the enhanced structure and a metal line in one of the metallization layer of the interconnect structure is formed to pass through the gap. Hence, the metal line is isolated form the enhanced structure. The metal line extends from the CSR region, traverses the enhanced structure and electrically connects to the DUT structure in the circuit region. In another example, the interconnect structure is omitted.

The method 100 continues with block 510 in which a first set of probe pads is formed on the CSR region. A conductive layer is disposed over the dielectric layer and over the stacked metallization layers and via layers. Various depositing, patterning and etching processes may be used to form the structure of the first probe pad in the conductive layer. The conductive layer may include aluminum or aluminum alloy. In one example, the first probe pad contacts the underlying interconnect structure and electrically connects to the DUT structure. In another example, a metal line connected to the first probe pad is simultaneously formed in the same conductive layer of the first probe pad. The metal line extends from the CSR region, traverses the enhanced structure, and connects to the DUT structure in the circuit region.

Other layers, lines, vias and structures may also be provided before, during, or after the steps of method 500. The described process order is variable in further embodiments.

Various embodiments of the present disclosure may be used to improve previous manufacturing processes for a semiconductor chip having a probe pad. In some embodiments, a probe pad formed in a CSR region enables to perform parametric tests on DUTs after dicing process. Through parametric tests on DUTs, it helps to predict the yield of functional integrated circuitries in the circuit regions. In further embodiments, the probe pad in the CSR region does not consume extra space for functional integrated circuits and circuit routing in the circuit region. In another embodiment, the structure of semiconductor chip in this disclosure keeps the integrity of the enhanced structure without reducing mechanical strength to prevent chip edge cracks. The conventional testlines are only used to measure the test structures in the scribe line regions. The yield of the functional circuits is predicted by the parameter tests of the testlines rather than directly measure the functional circuits themselves. In other embodiments, a probe pad formed in a CSR region is connected to a functional circuit in the circuit region. The electrical performances of the functional circuit could be directly measured through the probe pad in the CSR region. Some embodiments of this disclosure moderate the shortcomings of the conventional methods.

One form of the present disclosure involves a semiconductor chip. The semiconductor chip includes a circuit region and a corner stress relief (CSR) region. The CSR region is in a corner of the semiconductor chip. An electrical element is disposed on the circuit region. The electrical element includes a device under test (DUT) structure or a functional circuit. A probe pad is disposed on the CSR region. A metal line extends from the circuit region to the CSR region to electrically connect the electrical element and the probe pad.

Another form of the present disclosure involves a semiconductor chip. The semiconductor chip includes a circuit region and a corner stress relief (CSR) region. The CSR region is in a corner of the semiconductor chip. An enhanced structure is disposed between the circuit region and the CSR region. A probe pad is disposed on the CSR region. A metal line extends from the circuit region, traverses the enhanced structure, and connects to the probe pad in the CSR region.

Still another form of the present disclosure involves a semiconductor chip. The semiconductor chip includes a circuit region, a corner stress relief (CSR) region and a seal ring region. The CSR region is in a corner of the semiconductor chip. The seal ring region surrounds the circuit region and the CSR region. A seal ring structure is disposed on the seal ring region. An enhanced structure is disposed between the circuit region and the CSR region, and connected to sides of the seal ring structure. The enhanced structure comprises a plurality of stacked metallization layers and via layers. More than one probe pad is disposed on the CSR region. A metal line extends from the circuit region, traverses the enhanced structure and connects to the more than one probe pad in the CSR region. The metal line is in a same layer of one of the metallization layers.

Although exemplary embodiments have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A semiconductor chip, comprising:
    a circuit region and a corner stress relief (CSR) region, the CSR region being a corner of the semiconductor chip comprising a triangle defined by a seal ring structure on a first side, the seal ring structure on a second side, and an enhanced structure on a third side;
    a device under test (DUT) structure or a functional circuit disposed on the circuit region;
    a probe pad disposed on the CSR region; and
    a metal line traversing the enhanced structure and extending from the circuit region to the CSR region to electrically connect the probe pad to the DUT structure or the functional circuit.

2. The semiconductor chip of claim 1, wherein the probe pad occupies a substantially rectangular area having edges, each long edge having a length D1 and each short edge having a length D2, respectively, wherein the lengths D1 and D2 are within a range from about 10 μm to about 20 μm.

3. A semiconductor chip, comprising:
    a circuit region and a corner stress relief (CSR) region, the CSR region being a corner of the semiconductor chip;
    an enhanced structure disposed between the circuit region and the CSR region and extending between a first side of the semiconductor ship and a second side of the semiconductor chip along a border of the CSR region;
    at least two probe pads disposed on the CSR region; and
    a metal line extending from the circuit region, traversing the enhanced structure, and connecting to one of the at least two probe pads in the CSR region.

4. The semiconductor chip of claim 3, wherein the enhanced structure comprises a plurality of stacked metallization layers and via layers, the metal line being in one of the metallization layers and electrically isolated from the enhanced structure.

5. The semiconductor chip of claim 3, wherein the metal line passes over the enhanced structure.

6. The semiconductor chip of claim 3, wherein the metal line passes under the enhanced structure.

7. The semiconductor chip of claim 3, wherein the metal line is in a same layer as the at least one probe pad.

8. The semiconductor chip of claim 3, wherein the CSR region comprises a plurality of stacked metallization layers and via layers, the at least two probe pads and the metal line being in the topmost metallization layer.

9. The semiconductor chip of claim 3, wherein each of the at least two probe pads occupies a substantially rectangular area having edges, each long edge having a length D1 and each short edge having a length D2, respectively, the lengths D1 and D2 are within a range from about 10 μm to about 20 μm.

10. The semiconductor chip of claim 9, wherein the CSR region occupies a substantially right triangular area having perpendicular edges, the perpendicular edges having lengths of L1 and L2, respectively, and the lengths D1 and D2 are within a ratio form about 20% to about 50% of the lengths L1 and L2.

11. The semiconductor chip of claim 3, further comprising a plurality of stacked metallization layers and via layers underlying one of the at least two probe pads, and the metal line is in one of the metallization layers.

12. The semiconductor chip of claim 3, further comprising a device under test (DUT) structure or a functional circuit disposed on the circuit region electrically connected to one of the at least two probe pads through the metal line.

13. The semiconductor chip of claim 3, further comprising a seal ring region surrounding the circuit region and the CSR region, the seal ring region comprising a second set of probe pads disposed on the seal ring region.

14. A semiconductor chip, comprising:
    a circuit region, a corner stress relief (CSR) region and a seal ring region, the seal ring region surrounding the circuit region and the CSR region;
    a seal ring structure disposed on the seal ring region, the seal ring structure having a first side bordering a first side of the semiconductor chip and a second side bordering a second side of the semiconductor chip;
    an enhanced structure disposed between the circuit region and the CSR region, the enhanced structure having a first end connected to the first side of the seal ring and a second end connected to the second side of the seal ring, the enhanced structure comprising a plurality of stacked metallization layers and via layers;
    a probe pad disposed on the CSR region; and
    a metal line extending from the circuit region, traversing the enhanced structure, and connecting to the probe pad in the CSR region, wherein the metal line is in a same layer of one of the metallization layers.

15. The semiconductor chip of claim 14, wherein the metal line is in a same layer as the probe pad.

16. The semiconductor chip of claim 14, further comprising a device under test (DUT) structure or a functional circuit disposed on the circuit region electrically connecting to the probe pad through the metal line.

17. The semiconductor chip of claim 14, wherein the probe pad occupies a substantially rectangular area having edges, each long edge having a length D1 and each short edge having a length D2, respectively, wherein the lengths D1 and D2 are within a range from about 10 μm to about 20 μm.

18. The semiconductor chip of claim 17, wherein the CSR region occupies a substantially right triangular area having perpendicular edges, the perpendicular edges having lengths of L1 and L2, respectively, and the lengths D1 and D2 are within a ratio form about 20% to about 50% of the lengths L1 and L2.

19. The semiconductor chip of claim 14, wherein the CSR region comprises a plurality of stacked metallization layers and via layers, the probe pad and the metal line being in the topmost metallization layer.

20. The semiconductor chip of claim 14, wherein at least two probe pads are disposed on the CSR region.

* * * * *

UNITED STATES PATENT AND TRADEMARK OFFICE
CERTIFICATE OF CORRECTION

| | | |
|---|---|---|
| PATENT NO. | : 8,217,394 B2 | Page 1 of 1 |
| APPLICATION NO. | : 13/180304 | |
| DATED | : July 10, 2012 | |
| INVENTOR(S) | : Yang et al. | |

It is certified that error appears in the above-identified patent and that said Letters Patent is hereby corrected as shown below:

In Col. 9, line 47, claim 3, delete "ship" and insert --chip--.

Signed and Sealed this
Eleventh Day of September, 2012

David J. Kappos
*Director of the United States Patent and Trademark Office*